(12) United States Patent
Rao et al.

(10) Patent No.: US 7,820,491 B2
(45) Date of Patent: Oct. 26, 2010

(54) LIGHT ERASABLE MEMORY AND METHOD THEREFOR

(75) Inventors: Rajesh A. Rao, Austin, TX (US); Leo Mathew, Austin, TX (US); Ramachandran Muralidhar, Austin, TX (US); Bruce E. White, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 709 days.

(21) Appl. No.: 11/620,075

(22) Filed: Jan. 5, 2007

(65) Prior Publication Data
US 2008/0164512 A1    Jul. 10, 2008

(51) Int. Cl.
*H01L 21/82* (2006.01)
*G11C 16/04* (2006.01)

(52) U.S. Cl. .................. 438/128; 438/129; 438/130; 438/131; 438/132; 365/185.32; 365/185.29; 257/323; 257/E21.422

(58) Field of Classification Search .......... 257/E21.422, 257/323; 365/185.32, 185.29; 438/128–132
See application file for complete search history.

(56) References Cited

U.S. PATENT DOCUMENTS

| | | | | |
|---|---|---|---|---|
| 3,660,819 | A | * | 5/1972 | Frohman-Bentchkowsky ....... 365/185.18 |
| 4,213,192 | A | * | 7/1980 | Christensen, Sr. ........... 365/118 |
| 6,229,165 | B1 | * | 5/2001 | Sakai et al. ................. 257/291 |
| 6,323,515 | B1 | * | 11/2001 | Yamazaki et al. ........... 257/316 |

* cited by examiner

*Primary Examiner*—Bradley K Smith
*Assistant Examiner*—Alexander Belousov
(74) *Attorney, Agent, or Firm*—James L. Clingan, Jr.

(57) ABSTRACT

A semiconductor device has a semiconductor substrate that in turn has a top semiconductor layer portion and a major supporting portion under the top semiconductor layer portion. An interconnect layer is over the semiconductor layer. A memory array is in a portion of the top semiconductor layer portion and a portion of the interconnect layer. The memory is erased by removing at least a portion of the major supporting portion and, after the step of removing, applying light to the memory array from a side opposite the interconnect layer. The result is that the memory array receives light from the backside and is erased.

16 Claims, 5 Drawing Sheets

LIGHT ERASABLE MEMORY AND METHOD THEREFOR

FIELD OF THE INVENTION

This invention relates generally to semiconductor devices, and more specifically, to semiconductor devices with a light erasable memory.

BACKGROUND

Non-volatile memories (NVMs) have a major role in current semiconductor products either as stand alone devices or embedded applications such as onboard a chip having logic. A large percentage of microcontrollers include such an NVM. There are many applications where it is sufficient or at least beneficial to be able to erase an entire NVM array or subarray in a single operation. This operation is often called block erase. Typically such NVMs have a floating gate for each memory device. An alternative becoming available is using nanocrystals which results in many very small floating gates per memory cell. In either case a problem with block erase is that high voltages are required; higher than required for programming. These high voltages require special generation with specially made transistors that can support these higher erase voltages. To reduce the requirement of special high voltage transistors, erase voltage is split between the control gate of the memory cell and its channel. This requires a body contact which requires significant additional space and special processing in a semiconductor-on-insulator (SOI) substrate, which is becoming preferable to bulk silicon substrates for higher performance and lower power logic. Another problem for one time programmable (OTP) memories is that of process induced charging during processing of the overlying interconnect. This occurs for non-OTP memories as well but block erase is readily available for them. For OTP memories the processing induced charging is removed by ultra-violet (UV) erase but this is becoming more difficult to achieve because of the increased interconnect density and the dielectric materials being used. For example, silicon carbon nitride, which does not transmit UV well, may become one part of the dielectric used in the interconnect. In such a situation OTP memories may not be practical.

Thus, there is a need for improving one or more of these difficulties in erasing an NVM.

BRIEF DESCRIPTION OF THE DRAWINGS

The present invention is illustrated by way of example and is not limited by the accompanying figures, in which like references indicate similar elements. Skilled artisans appreciate that elements in the figures are illustrated for simplicity and clarity and have not necessarily been drawn to scale.

DETAILED DESCRIPTION OF THE DRAWINGS

Figure 1:
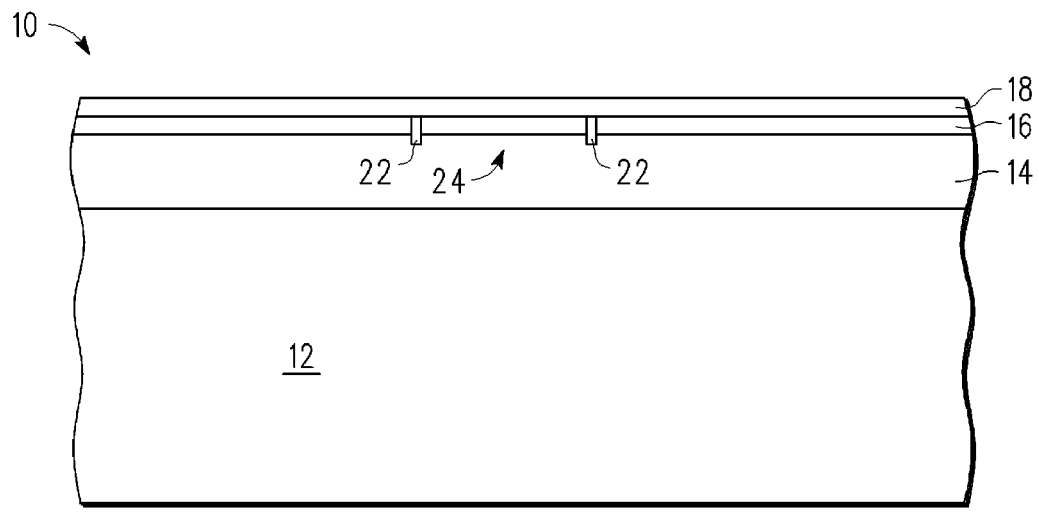
FIG. 1 is a cross-section of semiconductor device at a stage in processing according to a first embodiment.

In one aspect a non-volatile memory (NVM) array is erased by applying light from the backside of the active circuitry rather than through the interconnect. One technique for achieving this is to form an opening to the array from the backside. This opening is covered by a transparent film for protection. Another technique is to attach a light emitting device, such as a light-emitting diode (LED), to the backside near the array to be erased. The light applied is what is required for erasing which is typically ultra-violet (UV). This is better understood by reference to the drawings and the following description Shown in FIG. 1 is semiconductor device 10 comprising a supporting substrate 12, an insulating layer 14 over substrate 12, a semiconductor layer 16 over insulating layer 14, an interconnect layer 18 over semiconductor layer 16, a trench isolation 22 through semiconductor layer 16 and extending into insulating layer 14, and an NVM memory array 24 surrounded by trench isolation 22. Substrate 12 is preferably silicon. Insulating layer 14 is preferably silicon oxide. Semiconductor layer 16 is preferably silicon. Substrate 12, insulating layer 14, and semiconductor layer 16 together form a semiconductor-on-insulator (SOI) substrate. NVM array 24 is light erasable, preferably using UV. NVM array 24 may comprise floating gate memory cells that each have a single floating gate or multiple floating gates as for the case of using nanocrystals. NVM array 24 in this example is shown bounded by trench isolation 22. NVM array 24 may be the entire array portion of an NVM or subarray of the NVM. NVM array 24 includes the memory cells that have a portion in semiconductor layer 16 and the overlying portion of interconnect 18 that is used for connecting to the memory cells such as word lines and bit lines. Interconnect 18 comprises gates for logic and memory transistors as well as multiple layers of metal used for interconnecting underlying circuitry. Gates in interconnect layer 18 have a dual function of providing the gate function in forming transistors but also of extending as interconnects. Word lines, in this example, are for connecting to word line drivers and as control gates for the NVM memory cells. The top layer of interconnect layer 18 is a dielectric, preferably silicon oxide, to protect interconnect layer 18 and provide for good adhesion in a subsequent processing step. Semiconductor layer 16 is about 500 Angstroms in thickness. Interconnect layer 18 may be about 2 to 5 microns in thickness, which is much thicker than semiconductor layer 16. This is an example of the drawings not attempting to be to scale. Insulating layer 14 may be about 2000 Angstroms in thickness. Substrate 12 may be about 500 microns in thickness, which is about 4 orders of magnitude greater than semiconductor layer 16. Substrate 12, insulating layer 14, and semiconductor layer 16 together form a semiconductor-on-insulator (SOI) substrate. Although there are particular benefits to an SOI substrate, a bulk semiconductor, typically silicon, could be substituted. A very small top portion of the bulk silicon substrate would be analogous to semiconductor layer 16 for forming source/drains of transistors. The remaining portion would provide the needed support. In either SOI or bulk silicon, the major portion of the substrate is the supporting portion.

Figure 2:
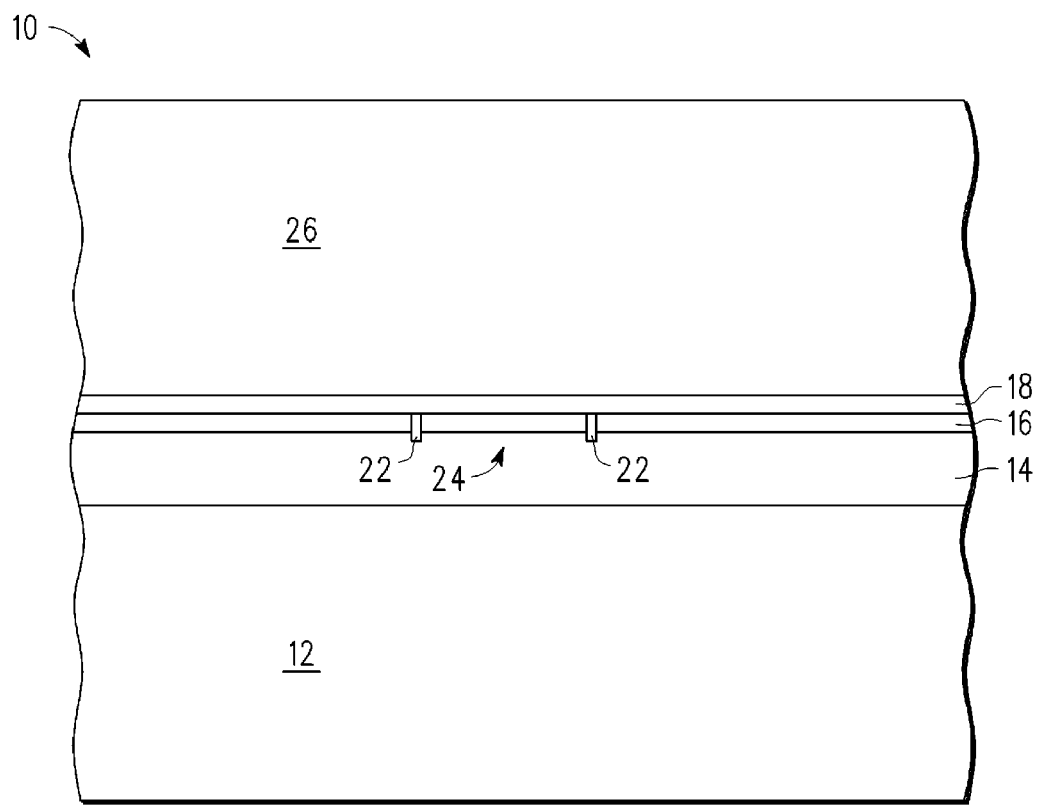
FIG. 2 is a cross-section of the semiconductor device of FIG. 1 at a subsequent stage in processing.

Shown in FIG. 2 is semiconductor device 10 after attaching a substrate 26 to interconnect layer 18. Substrate 26 may the same as substrate 12. The attaching is conveniently achieved by a conventional wafer bonding process which is easily reversed. Substrate 26 is used for handling purposes and may be reused.

Figure 3:
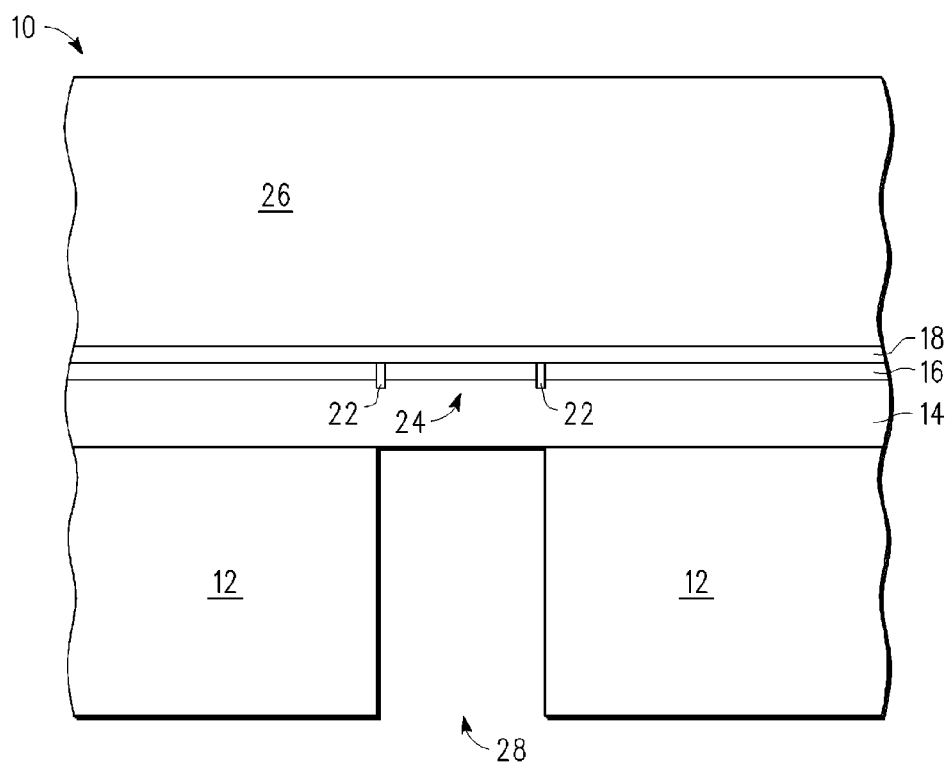
FIG. 3 is a cross-section of the semiconductor device of FIG. 2 at a subsequent stage in processing.

Shown in FIG. 3 is semiconductor device 10 after forming an opening 28 through substrate 12 to insulating layer 14. Opening 28 is aligned to memory array 24 so that light applied through opening 28 will reach all of memory array 24. Insulating layer 14 is a convenient etch stop for an etch used to etch substrate 12 which is silicon in this example. Other semiconductors, such as SiGe, also are conveniently etched selective to insulating layer 14 so that insulating layer 14 may also be used as an etch stop layer in those cases. Thus insulating layer 14 is sufficient to protect memory array 24 during the etch of opening 28. Opening 28 is shown with vertical sidewalls, which in practice may be difficult to achieve. Any slope must be taken into account in determining the size of the opening. Substrate 12 may also be thinned down prior to forming the opening to improve the slope characteristics of opening 28. Exemplary techniques for thinning include polishing, defoliation, and blanket etch-back. If this were a bulk silicon substrate, the opening would be substantially the same but would not have the benefit of the etch stop layer so would normally be expected to be a timed etch.

Figure 4:
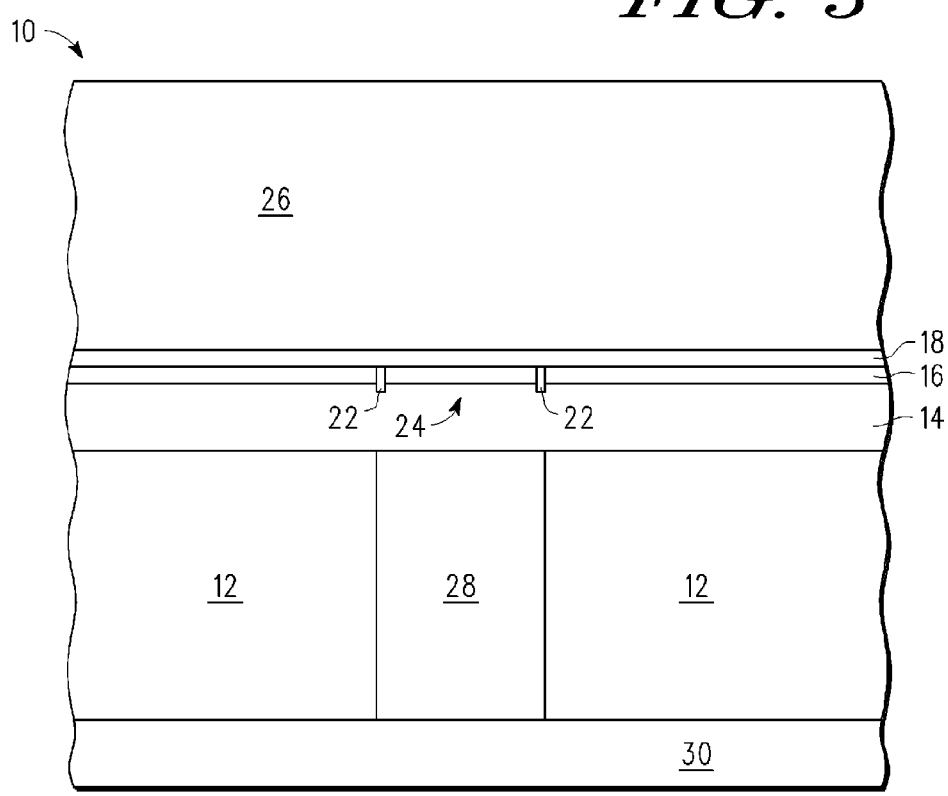
FIG. 4 is a cross-section of the semiconductor device of FIG. 3 at a subsequent stage in processing.

Shown in FIG. 4 is semiconductor device 10 after attaching a light-transmitting layer 30 to substrate 12 and covering opening 28. The particular transmitting characteristics are based on what is sufficient for erasing memory array 24. In this example, the memory array 24 is erasable by UV so that layer 30 needs to sufficiently transmit UV. Good exemplary materials are glass, quartz, and sapphire. If glass is used, for example, it can also be doped to improve its transmission characteristics. Layer 30 provides protection and some physical support to compensate for opening 28. Opening 28 will vary in size based on the size of memory array 24. The thickness of layer 30 will need to be thicker when opening 28 is larger, especially in a standalone memory when the array to be erased is a higher percentage of the entire chip. Alternatively, opening 28 may be filled with a light-transmitting material such as silicon oxide.

Figure 5:
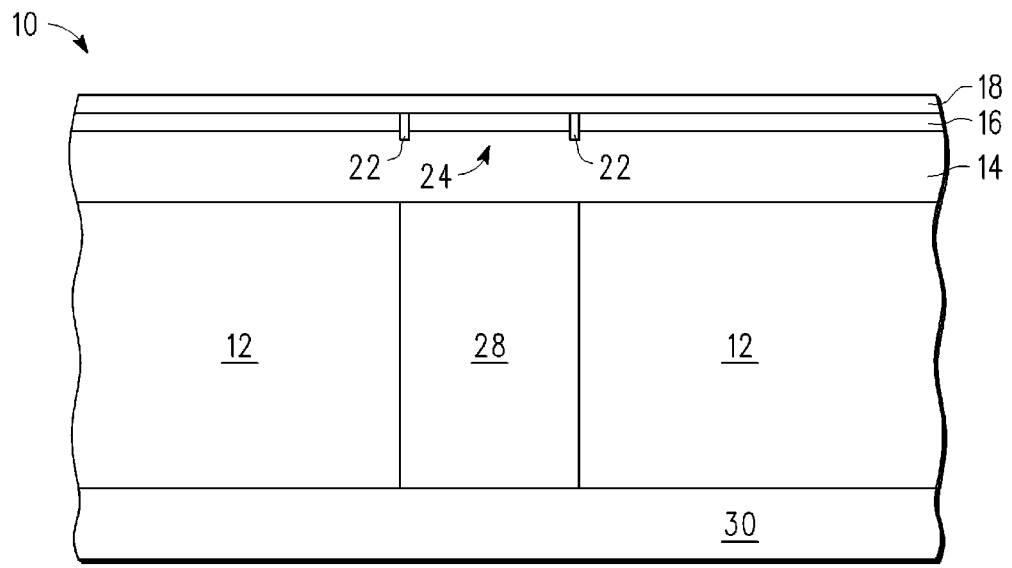
FIG. 5 is a cross-section of the semiconductor device of FIG. 4 at a subsequent stage in processing.

Shown in FIG. 5 is semiconductor device 10 after removal of substrate 26. Semiconductor device 10 may be complete at this point. Additional interconnects and/or contacts may also be added that are not shown in FIG. 5. Erase of memory array 24 is then performed by applying the proper light, UV in this case, through opening 28 to the backside, the side opposite interconnect 18, of memory array 24. Thus, memory array 24 is erased without the UV having to penetrate through interconnect layer 18 and without requiring a high erase voltage. This is beneficial in many NVM applications and may be enabling for NVMs that are OTP in which the interconnect is effectively opaque to UV.

Figure 6:
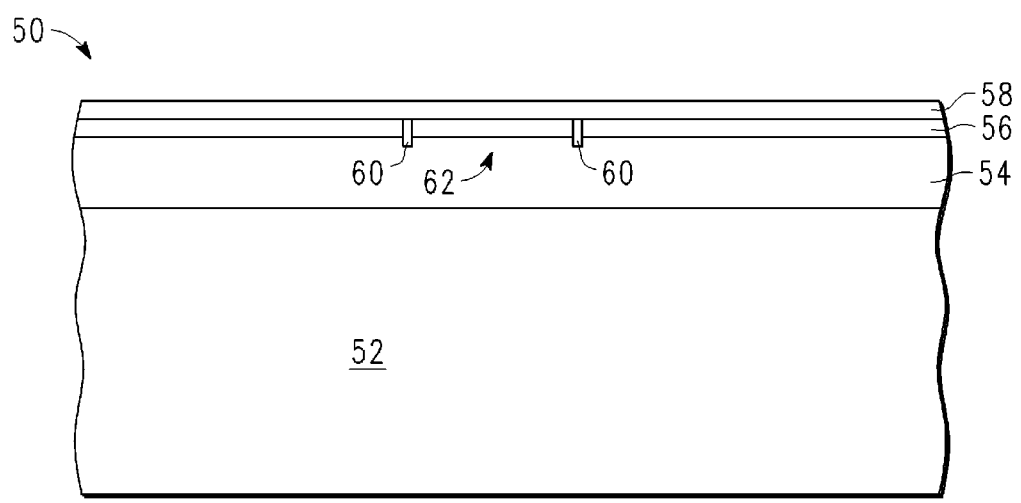
FIG. 6 is a cross-section of semiconductor device at a stage in processing according to a second embodiment.

Shown in FIG. 6 is a semiconductor device 50 comprising a substrate 52, an insulating layer 54 over substrate 52, a semiconductor layer 56 over insulating layer 54, an interconnect layer 58 over semiconductor layer 56, a trench isolation 60 through semiconductor layer 56 and extending into insulating layer 54, and an NVM memory array 62 surrounded by trench isolation 60. This is the same structure as semiconductor device 10 of FIG. 1.

Figure 7:
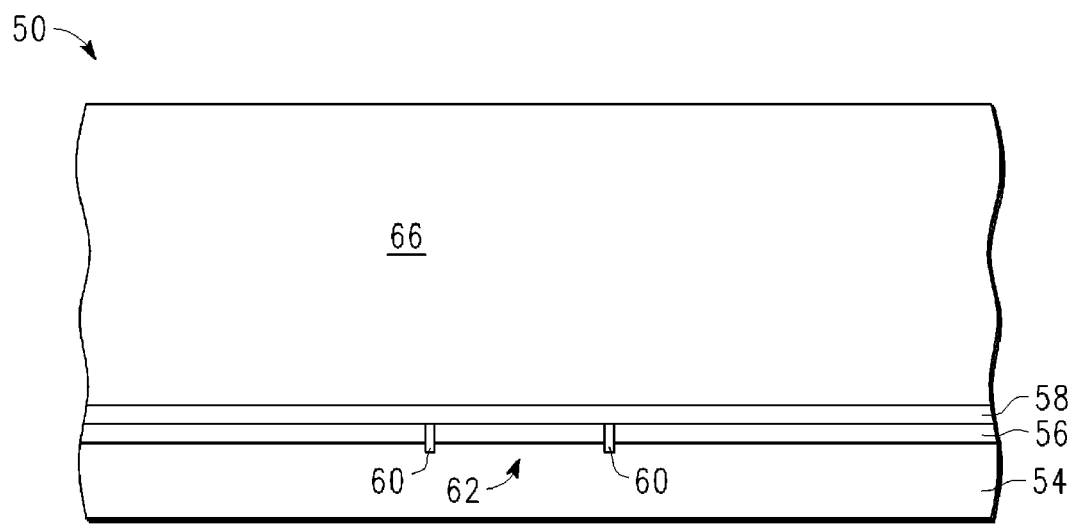
FIG. 7 is a cross-section of the semiconductor device of FIG. 6 at a subsequent stage in processing.

Shown in FIG. 7 is semiconductor device 50 after attaching substrate 66 to interconnect layer 58 and removing substrate 52. Substrate 66 is the same as substrate 52 and provides virtually all of the mechanical support of semiconductor device of FIG. 7. The removal of substrate 52 is preferably achieved by defoliation and then polishing to reach insulating layer 54. Some of insulating layer 54 may be removed. Insulating layer 54 can be made initially to thickness that results in the desired thickness after polishing. An etch back process could also be used either alone or in conjunction with defoliation. If this were a bulk silicon substrate, this type of removal would be possible but probably more difficult because insulating layer 54 makes it easier to define a stopping point in the removal.

Figure 8:
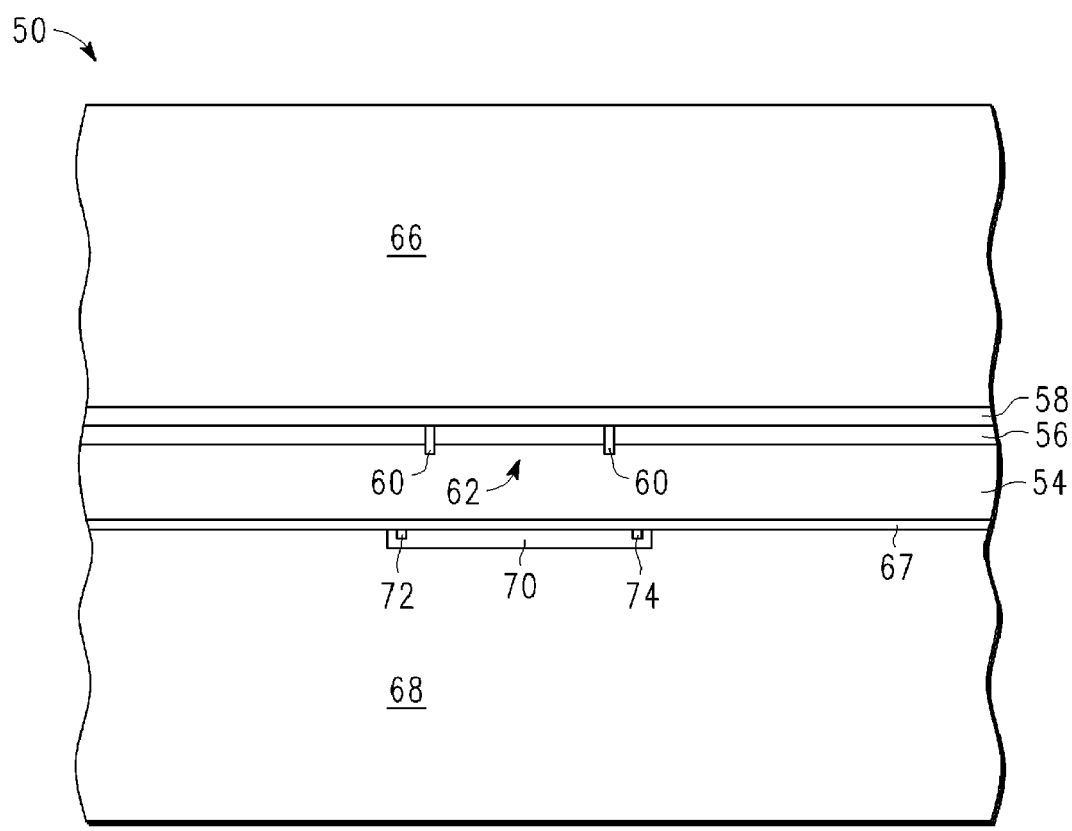
FIG. 8 is a cross-section of the semiconductor device of FIG. 7 at a subsequent stage in processing.

Shown in FIG. 8 is semiconductor device 50 after attaching a light emitting device 68 to insulating layer 54. Light emitting device, in this example, comprises a light emitting diode (LED) 70 that has contacts 72 and 74 facing insulating layer 54. Light emitting device 68 also has an oxide layer 67 for protecting LED 70 and for adhesion. The attaching is preferably by the well established technique of wafer bonding. With wafer bonding, there is effective adhesion between insulating layer 54 and oxide layer 67. LED 70 is aligned to memory array 62 so that all of memory array 62 is exposed to light emitted by LED 70. LED 70, in this example, emits significant UV. LED 70 is preferably a type of gallium nitride based heterojunction diode that is doped with aluminum and/or indium. Gallium nitride is a wide band gap material that provides UV at sufficient photon energy of 3 eV for achieving erase. Also the doping with aluminum and/or indium allows for tuning the bandgap to achieve the optimum photon energy for the UV for achieving erase. The doping also tailors the lattice constant allowing for ease of heterojunction LED fabrication. Light emitting device 68 not only provides LED 70 but also provides physical support.

Figure 9:
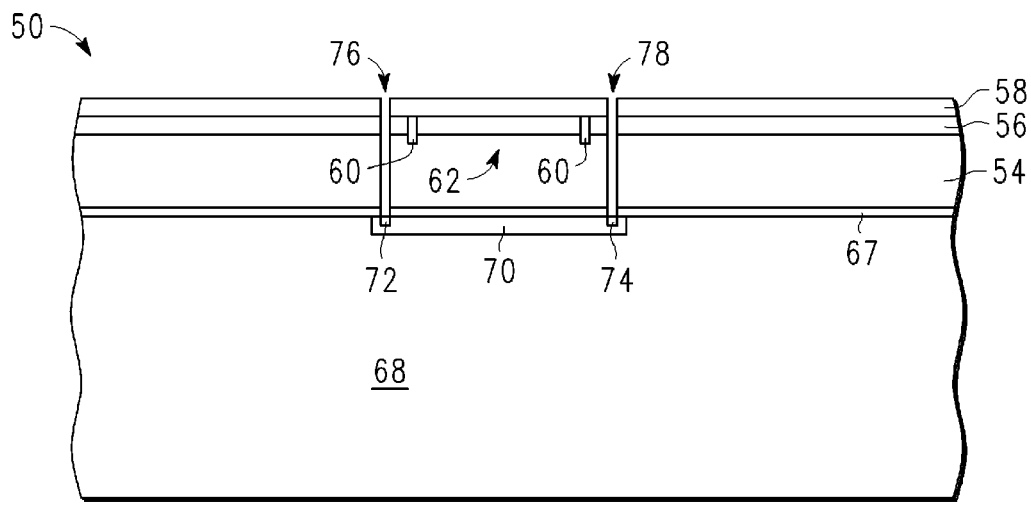
FIG. 9 is a cross-section of the semiconductor device of FIG. 8 at a subsequent stage in processing.

Shown in FIG. 9 is a packaged semiconductor device 50 after removing substrate 66 and forming vias 76 and 78 through interconnect layer 58, semiconductor layer 56, insulating layer 54, and oxide layer 67 to expose contacts 72 and 74, respectively.

Figure 10:
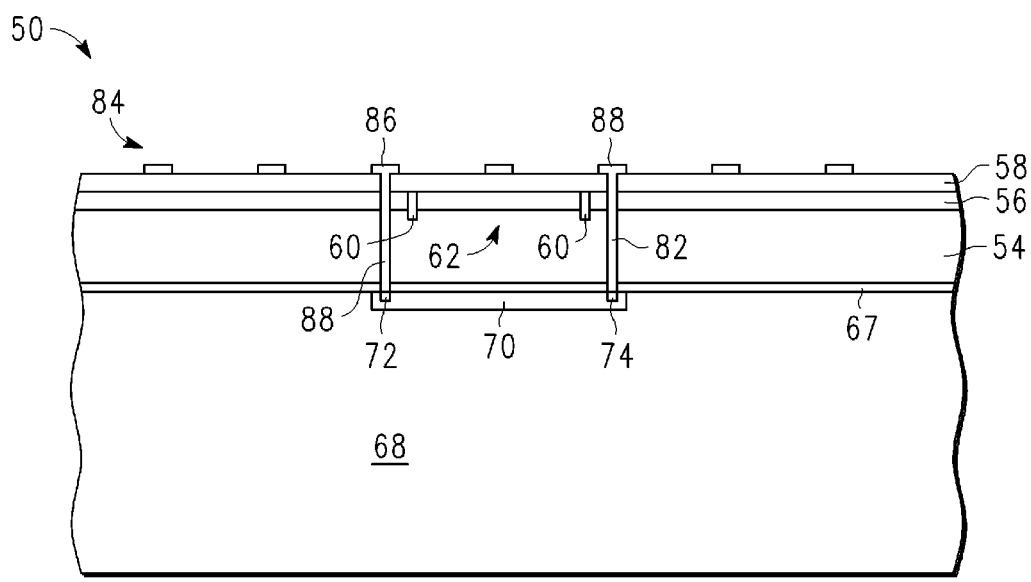
FIG. 10 is a cross-section of the semiconductor device of FIG. 9 at a subsequent stage in processing.

Shown in FIG. 10 is semiconductor device 50 after filling vias 76 and 78 so as to make electrical contact to contacts 72 and 74 available to the top of interconnect layer 58 or even within interconnect layer 58. Also shown as being formed are plurality of contacts 84 on the top surface of interconnect layer 58. Plurality of contacts 84 comprises a plurality of contacts that are for contacting interconnect layer 58 and thus ultimately circuitry of semiconductor layer 56 and interconnect layer 58 and also comprises contacts 86 and 88 that make physical and electrical contact with contacts 72 and 74, respectively. Thus, LED 70, when activated, emits enough UV to completely erase memory array 62. LED 70 can be activated externally through contacts 86 and 88. LED 70 may additionally or alternatively be activated by the circuitry of semiconductor layer 56 and interconnect layer 58. Thus, for example, a processor may be embedded with memory array 62 in which the processor initiates a block erase of memory array 62 electrically but the erase itself is performed by light. This avoids the high voltage typically required of an erase and thus benefits NVMs in that way. It also allows for an erase under external control electrically. Thus, one use would be to convert what would normally be an OTP memory, which is relatively simpler to make, to one that can be programmed multiple times because it can be erased multiple times.

Thus described is method for erasing a semiconductor device. The semiconductor device comprises a semiconductor substrate comprising a top semiconductor layer portion and a major supporting portion under the top semiconductor layer portion, an interconnect layer over the semiconductor layer, and a memory array in a portion of the top semiconductor layer portion and a portion of the interconnect layer. The, method of erasing the memory array, comprises removing at least a portion of the major supporting portion; and after the step of removing, applying light to the memory array from a side opposite the interconnect layer. The step of removing may be further characterized by forming an opening in the major supporting portion. The semiconductor substrate may be further characterized by comprising a insulating layer between the major supporting surface and the top semiconductor layer portion; wherein the step of removing is further characterized by the opening extending through the major supporting portion to the insulating layer. The method may further comprise attaching a light transmitting layer to the major supporting portion and over the opening. The step of applying light may be further characterized by the light being UV. The method may further comprise attaching a supporting substrate to the interconnect layer before the step of removing at least a portion and removing the supporting substrate after the step of removing at least a portion. The step of removing at least a portion may be further characterized by removing substantially all of the major supporting portion to leave an exposed backside of the semiconductor substrate. The method may further comprise attaching a light emitting device having a light emitting diode (LED) to the exposed backside of the semiconductor substrate. The method may further comprise attaching a light emitting device having a gallium nitride based heterojunction diode to the exposed backside of the semiconductor substrate. The method may further comprise forming contacts from the interconnect layer to the light emitting device through the top semiconductor layer portion.

Also described is a method comprising steps of obtaining, forming attaching, removing at least a portion, and removing a supporting substrate. The step of obtaining comprises obtaining a semiconductor substrate having a top semiconductor layer portion and a major supporting portion under the top semiconductor layer portion. The step of forming comprises forming a memory array and an interconnect layer wherein the interconnect layer is over the top semiconductor layer portion and the memory array is in a first portion of the top semiconductor layer portion and a first portion of the interconnect layer. The step of attaching comprises attaching the supporting substrate to the interconnect layer. The step of removing at least a portion comprises removing at least a portion of the major supporting portion after the step of attaching. The step of removing the supporting substrate comprises removing the supporting substrate after the step of removing. The step of applying comprises applying light of at least 3 eV toward the memory array from a side opposite to the interconnect layer. The step of removing at least a portion may further comprise removing substantially all of the major supporting portion to leave an exposed backside of the semiconductor substrate. The method may further comprise attaching a light emitting device having a gallium nitride based heterojunction diode to the exposed backside of the semiconductor substrate. The method may further comprise forming a via from the interconnect layer to the light emitting device and filling the via with conductive material. The step of obtaining may be further characterized by the semiconductor substrate having an insulating layer between the top semiconductor layer portion and the major supporting portion. The step of removing at least a portion may be further characterized by exposing the insulating layer. The step of removing at least a portion may be further characterized by forming an opening aligned to the memory array in the major supporting portion. The step of obtaining may be further characterized by the semiconductor substrate having an insulating layer between the top semiconductor layer portion and the major supporting portion. The step of removing at least a portion may be further characterized by exposing the insulating layer. The method may further comprise attaching a light transmitting layer to the top semiconductor layer portion and over the opening.

Further described is a semiconductor device. The semiconductor device comprises an interconnect layer over a semiconductor layer. The semiconductor device comprises a memory array in a portion of the semiconductor layer and a portion of the interconnect layer, wherein the memory array has a backside, wherein the backside is opposite the interconnect layer. The semiconductor comprises erase means for erasing the memory array by applying light to the backside of the memory array. The erase means may comprise an opening in a semiconductor supporting under the semiconductor layer that is aligned to the memory array for transmitting light to the memory array. The erase means may comprise a gallium nitride based heterojunction diode attached to the semiconductor device on a side opposite from the interconnect layer.

In the foregoing specification, the invention has been described with reference to specific embodiments. However, one of ordinary skill in the art appreciates that various modifications and changes can be made without departing from the scope of the present invention as set forth in the claims below. For example, there were specific examples described for a particular LED, but another LED may be effective in some cases. Wafer bonding was described as the technique for described steps of attaching but other techniques may be effective. Accordingly, the specification and figures are to be regarded in an illustrative rather than a restrictive sense, and all such modifications are intended to be included within the scope of the present invention.

Benefits, advantages, solutions to problems, and any element(s) that may cause any benefit, advantage, or solution to occur or become more pronounced are not to be construed as a critical, required, or essential feature or element of any or all the claims. The terms "a" or "an", as used herein, are defined as one or more than one even if other elements are clearly stated as being one or more in the claims or specification. The term "plurality", as used herein, is defined as two or more than two. The term another, as used herein, is defined as at least a second or more. The term "coupled", as used herein, is defined as connected, although not necessarily directly, and not necessarily mechanically. Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

What is claimed is:

1. For a semiconductor device comprising a semiconductor substrate comprising a top semiconductor layer portion and a major supporting portion under the top semiconductor layer portion, an interconnect layer over the semiconductor layer, and a memory array in a portion of the top semiconductor layer portion and a portion of the interconnect layer, a method of erasing the memory array, comprising:

removing at least a portion of the major supporting portion;
after the step of removing, applying light to the memory array from a side opposite the interconnect layer;
attaching a supporting substrate to the interconnect layer before the step of removing at least a portion; and
removing the supporting substrate after the step of removing at least a portion.

2. The method of claim 1 wherein the step of removing is further characterized by forming an opening in the major supporting portion.

3. The method of claim 2, wherein the semiconductor substrate is further characterized by comprising a insulating layer between the major supporting surface and the top semiconductor layer portion; wherein the step of removing is further characterized by the opening extending through the major supporting portion to the insulating layer.

4. The method of claim 3 further comprising:
attaching a light transmitting layer to the major supporting portion and over the opening.

5. The method of claim 1 wherein the step of applying light is further characterized by the light being UV.

6. The method of claim 1 wherein the step of removing at least a portion is further characterized by removing substantially all of the major supporting portion to leave an exposed backside of the semiconductor substrate.

7. The method of claim 6 further comprising:
attaching a light emitting device having a light emitting diode (LED) to the exposed backside of the semiconductor substrate.

8. The method of claim 6 further comprising:
attaching a light emitting device having a gallium nitride based heterojunction diode to the exposed backside of the semiconductor substrate.

9. The method of claim 8 further comprising:
forming contacts from the interconnect layer to the light emitting device through the top semiconductor layer portion.

10. The method of claim 1, wherein:
the step of applying light comprises applying light of at least 3 eV toward the memory array from a side opposite to the interconnect layer.

11. The method of claim 10 wherein the step of removing at least a portion comprises removing substantially all of the major supporting portion to leave an exposed backside of the semiconductor substrate, further comprising:
attaching a light emitting device having a gallium nitride based heterojunction diode to the exposed backside of the semiconductor substrate.

12. The method of claim 11, further comprising:
forming a via from the interconnect layer to the light emitting device; and
filling the via with conductive material.

13. The method of claim 12, wherein:
the semiconductor substrate is further characterized as having an insulating layer between the top semiconductor layer portion and the major supporting portion; and
the step of removing at least a portion is further characterized by exposing the insulating layer.

14. The method of claim 10, wherein the step of removing at least a portion is further characterized by forming an opening aligned to the memory array in the major supporting portion.

15. The method of claim 14, wherein
the semiconductor substrate is further characterized as having an insulating layer between the top semiconductor layer portion and the major supporting portion; and
the step of removing at least a portion is further characterized by exposing the insulating layer.

16. The method of claim 15 further comprising:
attaching a light transmitting layer to the top semiconductor layer portion and over the opening.

* * * * *